United States Patent
Lim et al.

(10) Patent No.: US 9,836,095 B1
(45) Date of Patent: Dec. 5, 2017

(54) MICROELECTRONIC DEVICE PACKAGE ELECTROMAGNETIC SHIELD

(71) Applicant: Intel Corporation, Santa Clara, CA (US)

(72) Inventors: Min Suet Lim, Simpang Ampat (MY); Eng Huat Goh, Penang (MY); Khang Choong Yong, Puchong (MY); Boon Ping Koh, Seberang Jaya (MY); Wil Choon Song, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/282,481

(22) Filed: Sep. 30, 2016

(51) Int. Cl.
   *H01L 23/552* (2006.01)
   *G06F 1/18* (2006.01)
   *H01L 23/00* (2006.01)

(52) U.S. Cl.
   CPC ............ *G06F 1/182* (2013.01); *H01L 23/552* (2013.01); *H01L 24/33* (2013.01)

(58) Field of Classification Search
   CPC .................................................... H01L 23/522
   See application file for complete search history.

(56) References Cited

U.S. PATENT DOCUMENTS

| | | | | |
|---|---|---|---|---|
| 5,006,397 A * | 4/1991 | Durand | ............... | C09D 11/101 361/748 |
| 5,639,989 A * | 6/1997 | Higgins, III | ......... | H01L 23/552 174/386 |
| 5,998,867 A * | 12/1999 | Jensen | ................ | H01L 23/3135 174/104 |
| 6,542,374 B1 * | 4/2003 | Muramatsu | ......... | H05K 1/0274 257/669 |
| 6,866,908 B2 * | 3/2005 | Lichtenstein | ....... | H01L 23/3737 174/388 |
| 7,338,686 B2 * | 3/2008 | Kiyokawa | ............... | B22F 1/025 427/215 |
| 7,608,326 B2 * | 10/2009 | Johnson | ............. | H01L 23/3733 427/58 |
| 7,830,026 B2 * | 11/2010 | Beer | ....................... | H01L 23/29 257/789 |
| 8,115,307 B2 * | 2/2012 | Toyama | .................. | H01L 25/18 257/737 |
| 8,383,463 B2 * | 2/2013 | Kang | ............... | G06K 19/07749 257/659 |
| 8,420,437 B1 * | 4/2013 | Fan | ....................... | H01L 23/552 257/419 |
| 8,766,461 B1 * | 7/2014 | Partosa | ............ | H01L 23/49811 257/778 |

(Continued)

*Primary Examiner* — Evan Pert
(74) *Attorney, Agent, or Firm* — Schwegman Lundberg & Woessner, P.A.

(57) ABSTRACT

Microelectronic devices including an electromagnetic shield over a desired portion of a substrate. The magnetic shield is formed of conductive particles within a selectively curable layer, such as a solder resist material. After application to the substrate, the conductive particles are allowed to settle to form a conductive structure to serve as an electromagnetic shield. The electromagnetic shield can be formed primarily over regions of the substrate containing conductive traces coupled in the package to communicate signals presenting a risk of causing electromagnetic interference with other devices.

22 Claims, 7 Drawing Sheets

(56) References Cited

U.S. PATENT DOCUMENTS

| | | | | |
|---|---|---|---|---|
| 9,001,528 | B2* | 4/2015 | Yorita | H01L 21/565 |
| | | | | 361/816 |
| 9,545,043 | B1* | 1/2017 | Hamilton | H05K 9/003 |
| 9,685,413 | B1* | 6/2017 | Prakash | H01L 23/552 |
| 2005/0013082 | A1* | 1/2005 | Kawamoto | H01L 24/16 |
| | | | | 361/118 |
| 2005/0077596 | A1* | 4/2005 | Bauer | H01L 23/295 |
| | | | | 257/559 |
| 2008/0061406 | A1* | 3/2008 | Joh | H01L 23/552 |
| | | | | 257/660 |
| 2009/0045488 | A1* | 2/2009 | Chang | H01L 23/552 |
| | | | | 257/659 |
| 2009/0096051 | A1* | 4/2009 | Sugiyama | H01L 27/14618 |
| | | | | 257/435 |
| 2009/0133900 | A1* | 5/2009 | Nishikawa | C09J 9/02 |
| | | | | 174/250 |
| 2010/0140757 | A1* | 6/2010 | Kang | G06K 19/07749 |
| | | | | 257/659 |
| 2010/0315105 | A1* | 12/2010 | Fornes | C09D 5/24 |
| | | | | 324/693 |
| 2013/0256848 | A1* | 10/2013 | Kawabata | H01L 23/60 |
| | | | | 257/659 |
| 2014/0231973 | A1* | 8/2014 | Huang | H01L 23/49894 |
| | | | | 257/659 |
| 2015/0076670 | A1* | 3/2015 | Pan | H01L 23/552 |
| | | | | 257/659 |
| 2015/0243881 | A1* | 8/2015 | Sankman | H01L 23/295 |
| | | | | 361/679.55 |
| 2016/0336249 | A1* | 11/2016 | Kang | H01L 23/3128 |
| 2017/0037261 | A1* | 2/2017 | Fang | C09D 5/24 |
| 2017/0103951 | A1* | 4/2017 | Lee | H01L 21/4857 |
| 2017/0104149 | A1* | 4/2017 | Ugge | H01L 43/02 |
| 2017/0162527 | A1* | 6/2017 | Kim | H01L 24/13 |

\* cited by examiner

MICROELECTRONIC DEVICE PACKAGE ELECTROMAGNETIC SHIELD

TECHNICAL FIELD

Embodiments described herein relate generally to methods and apparatus for providing electromagnetic shielding in microelectronic devices; and more particularly relate to methods and apparatus for providing such electromagnetic shielding through conductive particles in a coating layer of the microelectronic device.

BACKGROUND

Microelectronic devices such as IC (integrated circuit) packages may include structures carrying signals presenting a risk of causing electromagnetic interference (EMI) with other systems. For example, processors may be mounted on a first surface of a substrate that contains conductive traces which redistribute the electrical contacts of the processor to other locations on the opposite side of the substrate, to facilitate attachment to other components. In some forms of such IC packages, some of the conductive traces will carry input/output signals presenting a risk of EMI with other semiconductor devices either within the IC package or located nearby.

Conventional mechanisms for addressing the risks of such EMI interference include moving other semiconductor devices a further distance from the processor substrate (or other device carrying the EMI-inducing signals) which increases the X-Y area required for the system. In other microelectronic devices, some structures provide shielding to minimize such EMI by adding one or more layers to the substrate including metal strips or a metal plate. The adding of these additional layer to the substrate not only add cost to the substrate, but the added layers also increase the overhaul height of the substrate (i.e., the Z-height) thereby increasing the overall package Z-height, which is undesirable for many applications. As a result of these disadvantages, another solution is needed.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

The present description addresses methods and structures for forming a microelectronic device having an electromagnetic shield over a desired portion of a substrate. In accordance with the described techniques, the electromagnetic shield may be provided over the portion of the substrate without the addition of structural layers to the substrate; and in many examples without impacting the Z-height of the microelectronic device.

The examples described herein use a selectively hardenable layer, such as a solder resist material, carrying conductive particles. The layer is applied only to desired regions of the substrate surface. The conductive particles are allowed to settle, such as at least partially under the effects of gravity, to form a conductive structure to serve as an electromagnetic shield. In some examples, the electromagnetic shield will be formed primarily over regions of the substrate containing conductive traces coupled in the package to communicate signals presenting a risk of causing EMI with other devices.

Once the conductive particles have settled to form the conductive structure, the solder resist layer will be cured (hardened), to retain the conductive particles in position and electrically interconnected.

In various examples, depending on the sensitivity of other devices, EMI can result from signals transitioning at different frequencies. For example, some memory interfaces can cause EMI with other devices. Memory input/output signals at approximately 2.9 GHz have been found to cause EMI with some forms of wireless communication devices, such as, for example, those operating in accordance with the IEEE 802.11 standard and its related family (Is addressed later herein). The EMI effect can increase with an increase in frequency of the signals. Memory input/output signals transitioning at 3.2 GHz or above, such as are expected to be reflected in the yet to be released DDR5/LPDDR5 (double rate/low power double data rate) specifications for dynamic random-access memory (DRAM) devices from the JEDEC Solid State Technology Association, have also been found to cause problematic EMI with such wireless devices. In other circumstances, other types of devices may also be subject to EMI from memory input/output signals or other signals transitioning at similar frequencies, including other input/output interfaces, processors, etc.

Figure 1A:
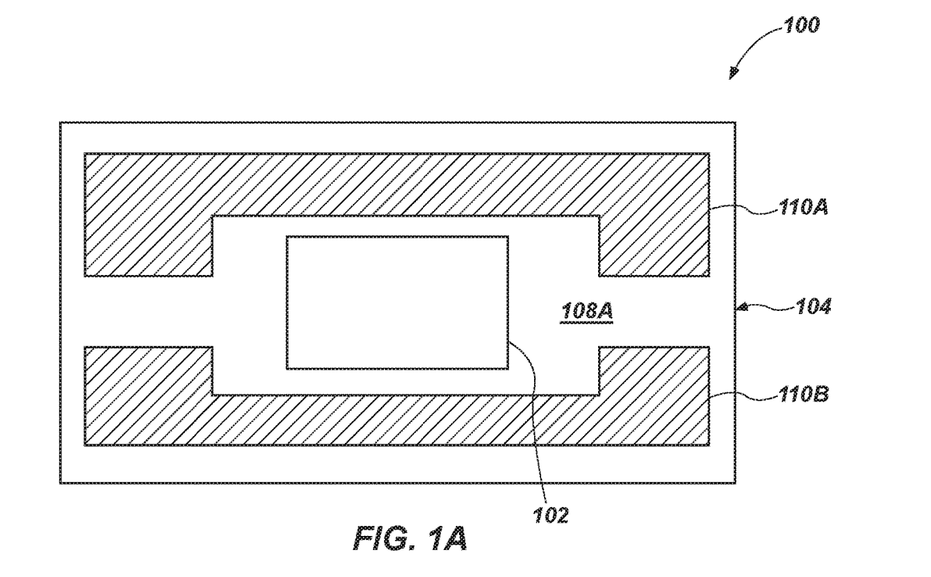
FIGS. 1A-B depict an example IC package in accordance with the techniques and structures described herein; depicted in FIG. 1A from a top view; and in FIG. 1B in a vertical cross-sectional view.
Figure 1B:
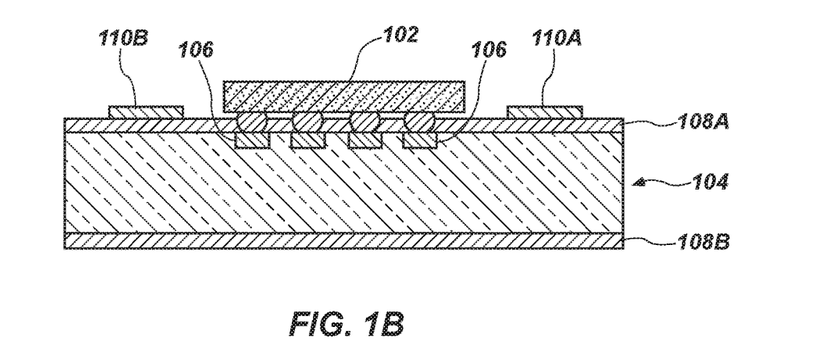

Referring now to FIGS. 1A-B, the figures depict schematic representations of an example microelectronic device in the form of an IC package 100. IC package 100 includes a semiconductor die 102 mounted to a first region of a substrate, indicated generally at 104. Substrate 104 may be of any of multiple forms known in the industry, providing conductive structures to redistribute contacts 106 coupled to semiconductor die 102 through conductive traces and to other contacts. Such conductive structures in substrates are well known to persons skilled in the art and are therefore not depicted in the schematic representation.

Substrate 104 is depicted with layers of solder resist 108A, 108B on upper and lower surfaces, respectively. IC package 100 also includes first and second electromagnetic shields 110A, 110B formed in regions extending partially around the location of semiconductor die 102. As can be seen in FIG. 1A, the height of first and second electromagnetic shields 110A, 110B above substrate 104 is less than that of semiconductor die 102. As a result, the electromagnetic shields do not increase the Z-height of the IC package.

The first and second electromagnetic shields 110A, 110B are preferably placed over the substrate 104 above conductive traces in substrate 104 carrying signals transitioning at frequencies potentially causing EMI for one or more system configurations, such as, for example, signals transitioning at frequencies at or above approximately 2.9 GHz, as discussed above.

Figure 2A:
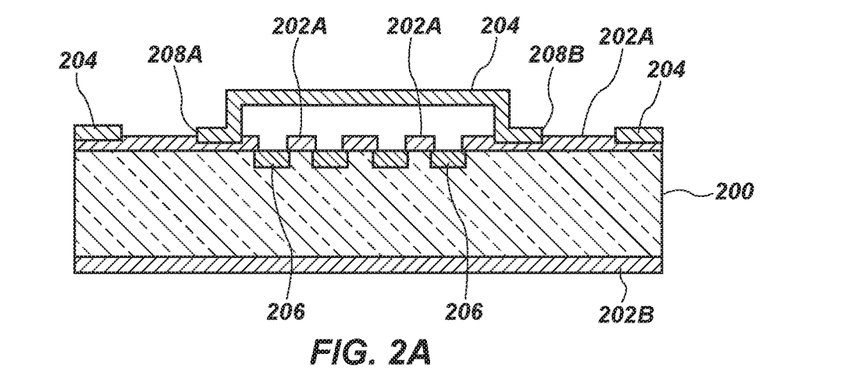
FIGS. 2A-C depict schematic representations of sequential stages of forming an electromagnetic shield, as described herein.
Figure 2B:
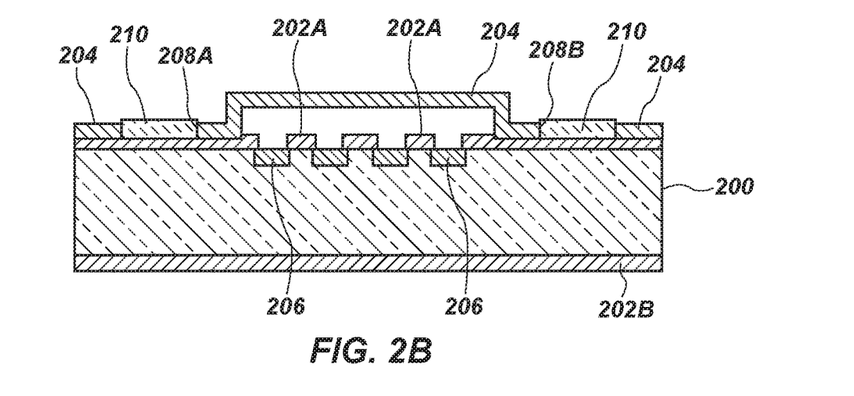
Figure 2C:
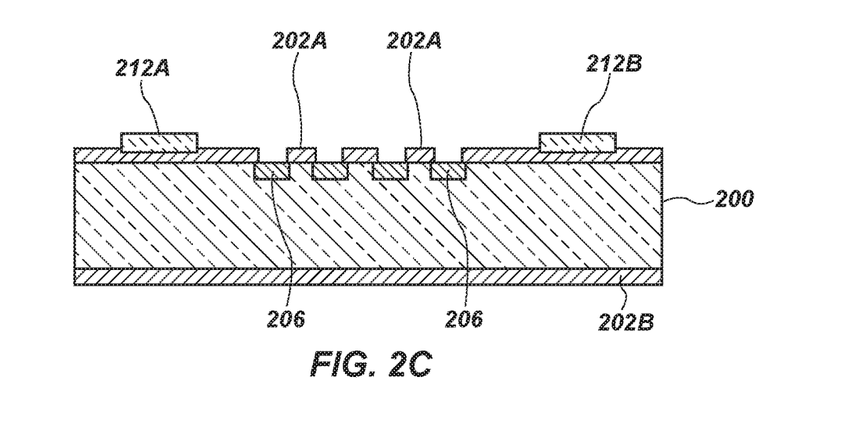

Referring now to FIGS. 2A-C, figures schematically depict sequential steps in the forming of electromagnetic shields, such as those of FIGS. 1A-C. In the depicted example, as shown in FIG. 2A, a substrate 200 includes solder resist layers 202A, 202B formed over upper and lower surfaces, respectively. A stencil 204 is placed over solder resist layer 202A, masking off the first region of substrate 200 containing contacts 206, and defining openings 208A, 208B where electromagnetic shield regions will be formed. As shown in FIG. 2B, a curable layer 210 is then formed within openings 208A, 208B. Curable layer 210 contains conductive particles. Once the conductive particles have been allowed to settle to form a conductive structure (as described in more detail in reference to FIGS. 3A-D), curable layer 210 will be cured to retain the particles in their settled state. Stencil 204 will then be removed, leaving cured layer 210 in place forming electromagnetic shields on substrate 200.

Figure 3A:
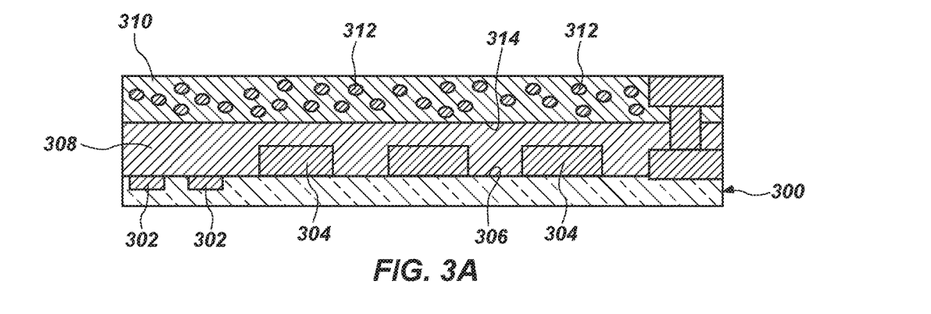
FIGS. 3A-D depict schematic representations of sequential stages of allowing conductive particles to form an electromagnetic shield.

Referring now to FIGS. 3A-D, those figures schematically depict a representative portion of a substrate assembly during various stages of forming a conductive structure which will serve as an electromagnetic shield. Referring first to FIG. 3A, therein is depicted an upper portion of a substrate 300, having conductive traces 302 formed therein, and contacts 304 on an upper surface 306. A first layer of solder resist 308 is in place on substrate 300. In many examples, this first layer of solder resist 308 will be a photo imageable solder resist. In some examples the photo imageable solder resist will be a dry film solder resist. A second layer of solder resist 310 has been formed on top of first layer of solder resist 308. Second layer of solder resist 310 includes conductive particles, indicated typically at 312. Conductive particles 312 can be of various materials which offer acceptable conductivity and relative permeability for the desired shielding. In many examples, second layer of solder resist 310 will be a liquid photoimageable solder resist. In some examples, the liquid photoimageable solder resist will have a viscosity selected, or adjusted, to allow particles of the selected material and size, as discussed below.

In many examples, the conductive particles will be metallic (i.e. metal-containing), either formed either of one or more metals or metal alloys, or a metal compound in combination with other materials, such as ferrites, having acceptable properties. For example, nickel has a conductivity of $1.45 \times 10^7$ Siemens/meter, and a relative permeability of 600. At a frequency of 3 GHz, a 0.2 μm thick layer of nickel is believed to offer a shielding effectiveness of approximately 60 dB, while a 2.0 μm thick layer of nickel is believed to offer a shielding effectiveness in excess of 200 dB. At a frequency of 0.5 GHz the shielding effectiveness of a 2.0 μm thickness of nickel is believed to be approximately 110 dB, while a 0.2 μm thickness of nickel is believed to offer a shielding effectiveness of approximately 68 dB.

As a result, the size, shape, and distribution of the conductive particles can be selected in combination with the material of the particles to provide acceptable shielding relative to the signals of concern. In some examples, the conductive particles will be generally spherical, subject to the constraints of manufacturing limitations. In the examples in which the particles are selected of nickel, particle sizes in the range of 0.3 μm to 2.0 μm, and potentially up to 5.0 μm may be suitable. Other metallic materials for the conductive particles include copper, silver, gold-nickel, tin-silver, and various forms of ferrites. Another factor in selecting metallic particles may include specific gravity, as the specific gravity will potentially impact the efficiency of settling of the particles within the solder resist material. Nickel has a specific gravity of 8,800 kg/m³, which is believed to be an acceptable level for settling in some liquid solder resist materials.

Substrate 300 also includes a contact 318 extending beyond first solder resist layer 308 and extending to the uppermost surface 320 of second solder resist layer 310. Contact 318 will form at least a portion of an electrical connection between the conductive structure formed of settled conductive particles 312 and a node at a reference voltage. In many examples, the node will be a part of, or coupled to, a ground plane.

Figure 3B:
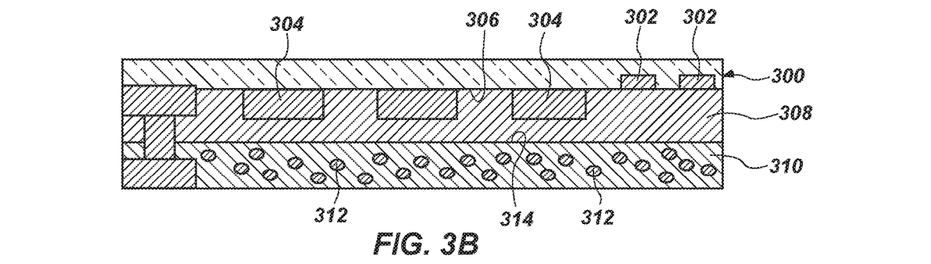
Figure 3C:
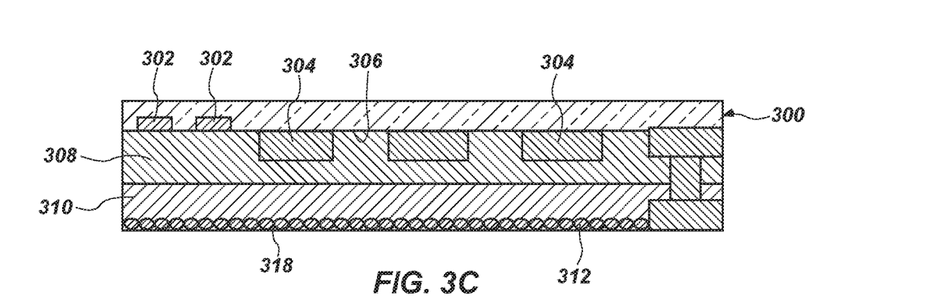

Once second layer of solder resist 310 has been deposited, in this example the substrate will be inverted, as depicted in FIG. 3B, to allow conductive particles 312 to settle at the (now lowermost) surface 316, away from surface 306 of substrate 300. In other examples, the first layer of solder resist 308 may be dimensioned and configured such that conductive particles 312 may be allowed to settle against surface 314, which would then not require inverting of the substrate as depicted in FIGS. 3B-C.

Figure 3D:
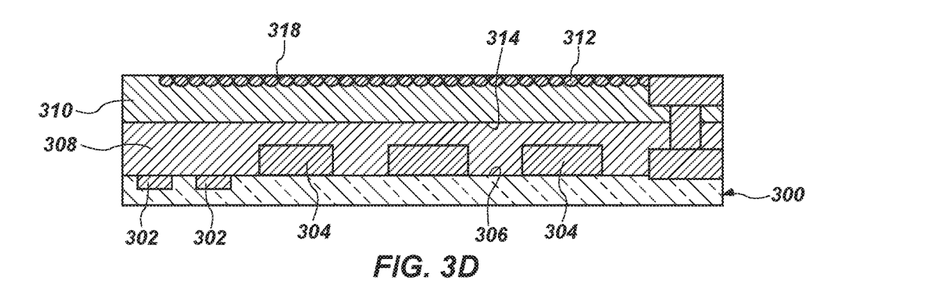

Once conductive particles 312 have settled at surface 316, second solder resist layer 308 will be cured to form a solid structure retaining settled conductive particles 312 as a conductive structure electrically coupled to contact 318, to form the electromagnetic shield over the selected region of substrate 300.

Figure 4A:
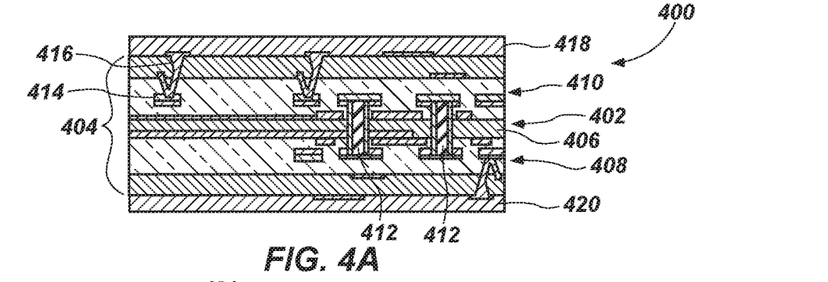
FIGS. 4A-I depict a representative section of a substrate during sequential stages of forming electromagnetic shield over a portion of the substrate.

Referring now to FIGS. 4A-I, the figures depict representative sections of a substrate during sequential stages of an example process 400 for forming an electromagnetic shield over a portion of the substrate. FIG. 4A depicts an example portion of a substrate assembly, indicated generally at 402. The substrate assembly 402 includes a substrate component extending between upper and lower surfaces, as indicated at 404. Substrate 404 can be of many possible configurations known to persons skilled in the art. In the depicted example, substrate 404 includes a central core 406 having redistribution structures on either side, as generally indicated at 408 and 410; substrate 404 includes vertically extending contacts, such as plated through hole (PTH) vias 412 extending through central core 406 to conductive structures, as indicated by example at 414, in each redistribution structure 408, 410. Substrate 404 also includes contacts, as indicated at 416, extending from respective conductive structures to a surface of substrate 404. In the depicted example, layers of solder resist 418, 420 have been formed over the upper and lower surfaces of substrate 404. In the following figures, the numbering of the elements of substrate 404 itself will be omitted for clarity. As will be apparent to persons skilled in the art having the benefit of the present disclosure, many structural configurations of substrate may be used with, and may benefit from, the described techniques and structures.

Figure 4B:
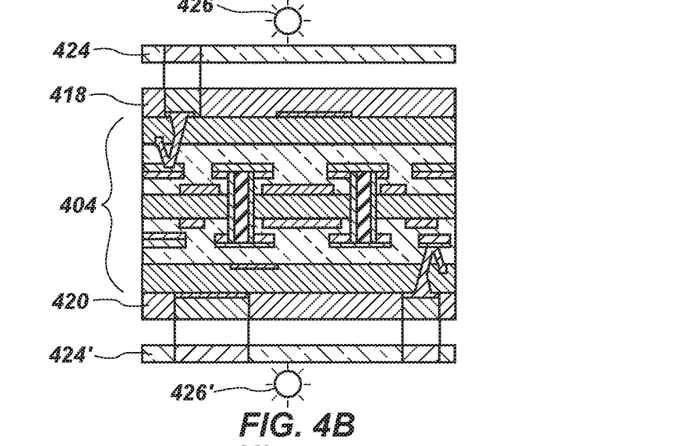

Referring to FIG. 4B, first and second masks 424, 424' have been disposed between the structure of FIG. 4A and a respective light source 426, 426', such as an ultraviolet (UV) having a wavelength suitable to cure the layers of solder mask 418, 420. In the depicted example, masks 424, 424' are positive pattern masks allowing light to shine except over regions to be later exposed for access to contacts or other conductive structures as indicated at mask regions 428, 430 and 432, and the regions of solder resist layers 416, 418 masked by such regions. While the figure depicts first and second masks 424, 424' and light sources 426, 426' on opposite sides of substrate assembly 402, solder resist layers 416, 420 may be exposed sequentially, rather than essentially simultaneously, as depicted.

Figure 4C:
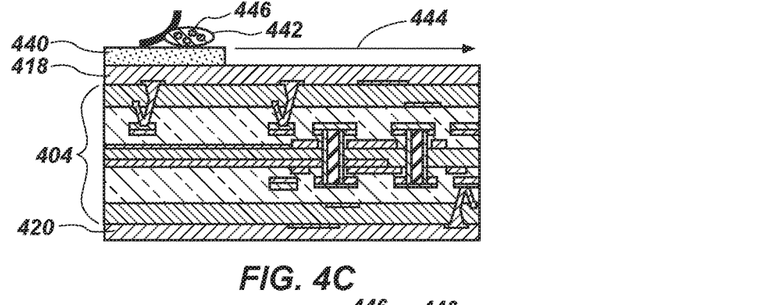
Figure 4D:
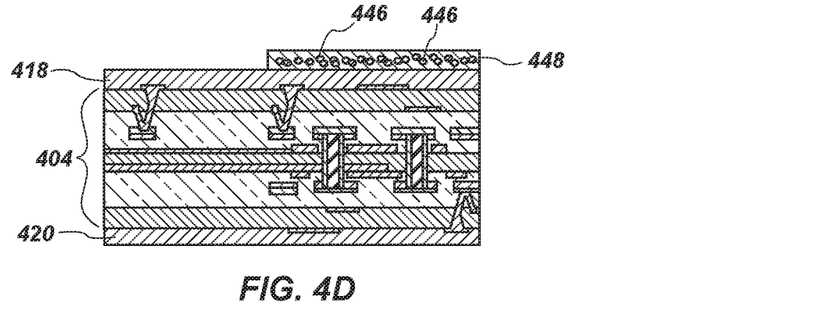

Referring to FIGS. 4C-D, a second layer of solder resist material 442 is formed, such as through screen printing, through use of a stencil 440 extending over one or more selected regions of substrate 404. Solder resist material 442 be distributed by an appropriate mechanism 438. Stencil 440 leaves an open region, as partially indicated at 444, exposed to receive the second layer of solder resist material 442. Solder resist material 442 is distributed to form a layer 448 in the open region 444, as depicted in FIG. 4D. As noted previously, the exposed region 444 of substrate assembly 402 will overlie a portion of substrate assembly 402 with conductors that will be connected to carry signals having a potential to cause EMI with other devices or circuits. As discussed above, solder resist material 442 include conductive particles having properties to be able to settle within solder resist material 442 two collectively form a conductive structure to serve as an EMI shield.

Figure 4E:
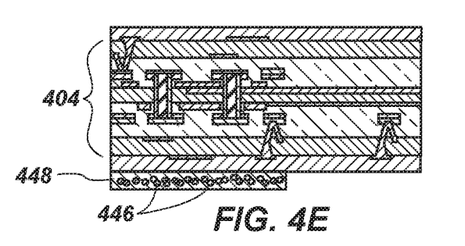
Figure 4F:
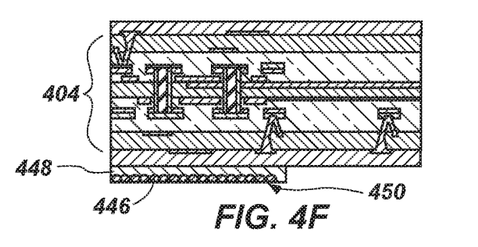

Referring to FIGS. 4E-F, substrate assembly 402 has been inverted to allow settling of conductive particles 446 within solder resist layer 448. In some examples, substrate assembly 402 may be inverted adjacent a supporting surface to maintain the defined lower surface of solder resist layer 448 during the inversion and particle settling process. Second solder resist material 442 will contain conductive particles in sufficient density within the material that they will settle to form a generally continuous conductive structure, as indicated generally at 450 in FIG. 4F. As will be discussed in more detail later herein the size of the conductive particles 446 and the density of their distribution within the solder resist material may be selected to provide a conductive structure of a desired thickness relative to the level of shielding desired.

Figure 4G:
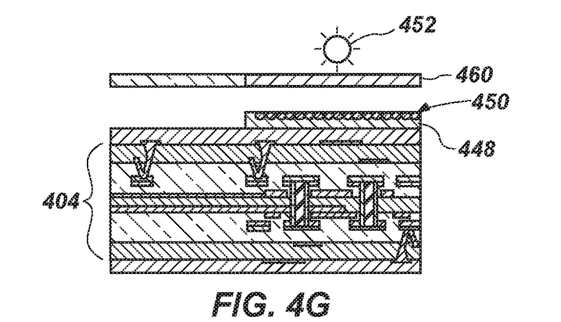

Referring to FIG. 4G, after settling of the conductive particles 446, another positive pattern glass mask 460 may be used to allow light source 452, to expose second solder resist layer 448. Mask 460 will preferably preclude the light from reaching the physically exposed portions of first solder resist layer 418 (the portions not under second solder resist layer 448), so as to not cure the portions left previously uncured to facilitate removal.

Figure 4H:
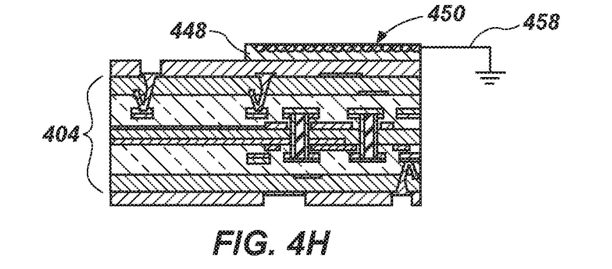
Figure 4I:
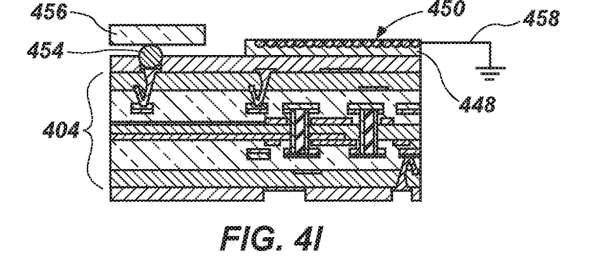

Referring to FIGS. 4H-I, the uncured solder resist can be removed from first solder resist layers 418 and 420, exposing contacts and other conductors, such as contact 416. As identified previously, in some portion of the region covered by the second solder resist layer 448, an electrical contact will extend approximately beyond first solder resist layer 418 for approximately the dimension of the thickness of layer 448, and thus will be in contact with the conductive structure 450 formed by settled conductive particles 446 (see the schematic representation of FIG. 3D). That electrical contact will be coupled to an appropriate voltage reference node, such as a ground plane 458, completing the EMI shield. A semiconductor die 456 may then be coupled, such as through solder balls 454 to substrate assembly 402, as described previously.

Figure 5:
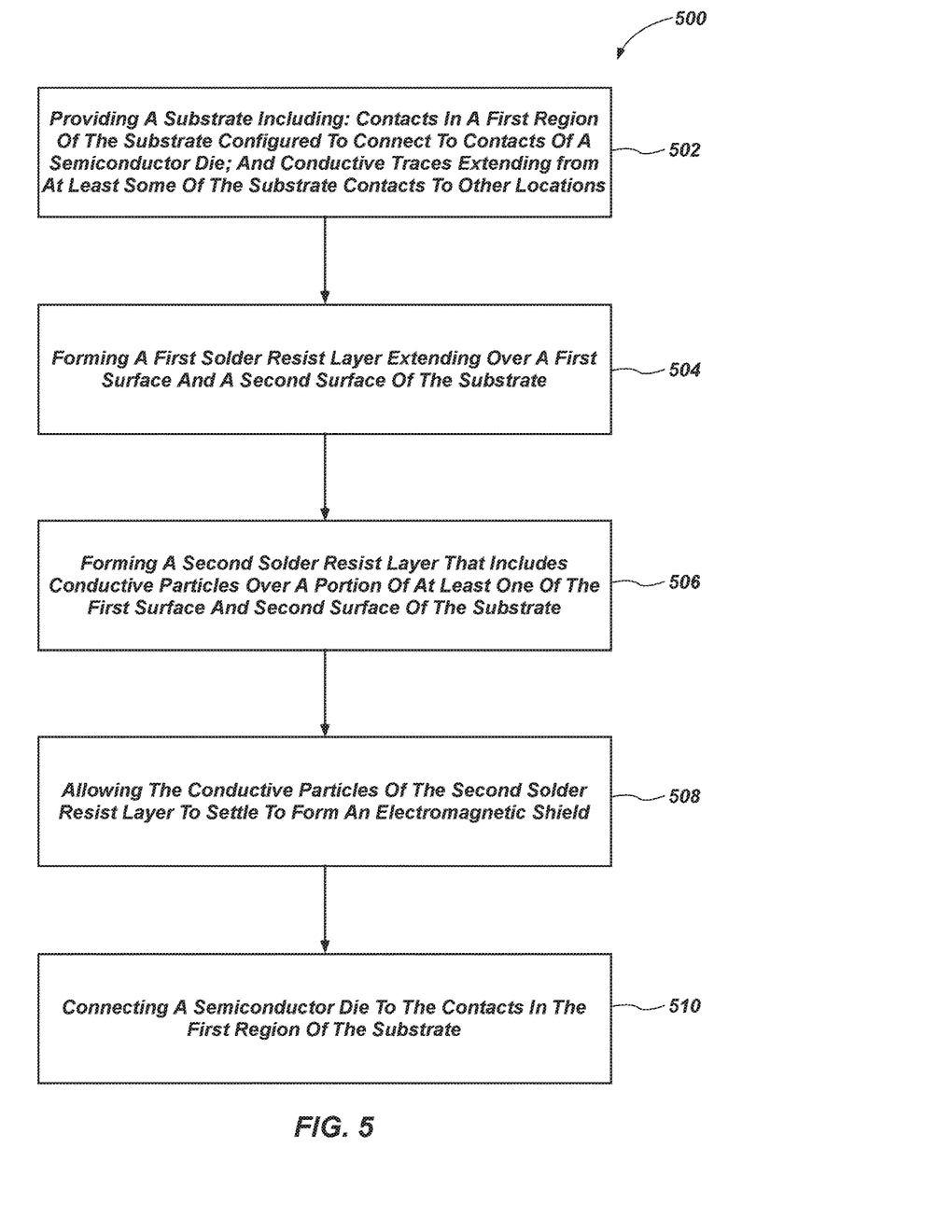
FIG. 5 is a flowchart of an example forming a microelectronic device package having an electromagnetic shield as described herein

Referring now to FIG. 5, therein is shown a flowchart of an example process 500 for forming a microelectronic device having an electromagnetic shield. Process 500 begins with the providing of a substrate, as indicated in 502, in which the substrate includes contacts in a first region configured to connect to contacts of the semiconductor die, and conductive traces extending from at least some of the contacts in the first region to other locations. As noted previously, some of these conductive traces will be place to communicate signals to or from the semiconductor die, which may cause EMI interference.

As indicated at 504, the first solder resist layer is formed over the first and second surfaces of the substrate. The first solder resist layer may be of various selected types, and in many examples will be a dry film imageable solder resist. In some examples, a dry film negative-type solder resist may be used. In this example process, forming a layer includes selectively curing the desired portions of the solder resist, such as through use of a glass mask, and a UV light source, as discussed above.

As indicated at 506, a second solder resist layer that includes conductive particles will then be formed over at least one of the first and second surfaces of the substrate (see FIGS. 3A and 4C-D). The solder resist of this second solder resist layer will preferably be a liquid photoimageable solder mask material. The second solder resist layer will be formed in one or more regions of the substrate in which the conductive traces will carry signals potentially causing EMI are located. In some examples, the substrate will be configured to receive a semiconductor die in a first region of a first surface, and the second solder resist layer will also be formed on the first surface in one or more areas laterally offset from the first region.

As indicated at 508, the conductive particles of the second solder resist layer are allowed to settle to form an essentially continuous conductive layer (see FIGS. 4E-F). In some examples, the conductive particles will be allowed to settle at least partially under the effects of gravity. In other examples, the condition may be established which will promote or assist gravity in achieving the settling. In some examples, the temperature of the substrate may be elevated, and/or the substrate may be vibrated to assist the settling. Once the conductive particles have settled to form an essentially continuous conductive layer, the second solder resist layer will be hardened to retain the particles in the settled position (see FIG. 4G).

As indicated at 510, unhardened (i.e. uncured) solder resist will then be removed from the substrate (see FIG. 4H). A semiconductor die may be connected to the contacts in the first region of the substrate to form the microelectronic device described EMI shielding over selected regions of the substrate (see FIG. 4I).

Figure 6:
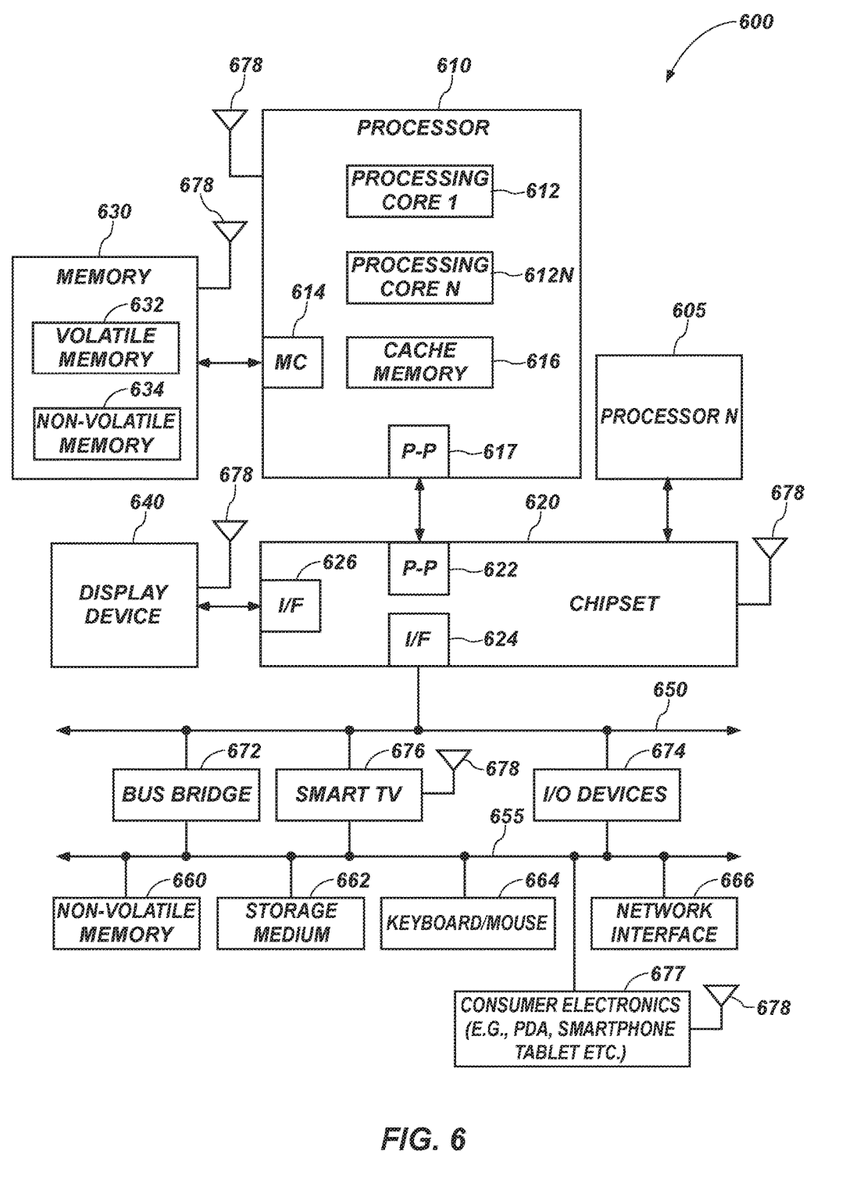
FIG. 6 is block diagram of an electronic system which may incorporate a microelectronic device package as described herein.

As noted earlier, many types of microelectronic devices may benefit from having an EMI shield formed in the manner described herein. One example of such a beneficial combination is a processor coupled on a substrate, in which regions of the substrate carrying I/O interface signals are likely to cause interference with other devices, such as wireless interface devices, other processing devices, etc.; and those regions of the substrate are shielded in the manner described. The resulting shielded microelectronic device package may then be included in a larger electronic device or system. For example, the below-described processor 610 may be mounted on a substrate having EMI shielding adjacent the processor, in the manner described herein.

FIG. 6 illustrates a system level diagram, according to one embodiment of the invention. For instance, FIG. 6 depicts an example of an electronic device (e.g., system) which may include the microelectronic device having an EMI shield having the structure as described in the present disclosure.

FIG. 6 is included to show an example of a higher level device application for the present invention. In one embodiment, system 600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 600 is a system on a chip (SOC) system.

In one embodiment, processor 610 has one or more processing cores 612 and 612N, where 612N represents the Nth processor core inside processor 610 where N is a positive integer. In one embodiment, system 600 includes multiple processors including 610 and 605, where processor 605 has logic similar or identical to the logic of processor 610. In some embodiments, processing core 612 includes, but is not limited to, pre-fetch logic to fetch instructions, decode logic to decode the instructions, execution logic to execute instructions and the like. In some embodiments, processor 610 has a cache memory 616 to cache instructions and/or data for system 600. Cache memory 616 may be organized into a hierarchal structure including one or more levels of cache memory.

In some embodiments, processor 610 includes a memory controller 614, which is operable to perform functions that enable the processor 610 to access and communicate with memory 630 that includes a volatile memory 632 and/or a non-volatile memory 634. In some embodiments, processor 610 is coupled with memory 630 and chipset 620. Processor 610 may also be coupled to a wireless antenna 678 to communicate with any device configured to transmit and/or receive wireless signals. In one embodiment, the wireless antenna interface 678 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 634 includes, but is not limited to, flash memory, phase change memory (PCM), read-only memory (ROM), electrically erasable programmable read-only memory (EEPROM), or any other type of non-volatile memory device.

Memory 630 stores information and instructions to be executed by processor 610. In one embodiment, memory 630 may also store temporary variables or other intermediate information while processor 610 is executing instructions. In the illustrated embodiment, chipset 620 connects with processor 610 via Point-to-Point (PtP or P-P) interfaces 617 and 622. Chipset 620 enables processor 610 to connect to other elements in system 600. In some embodiments of the invention, interfaces 617 and 622 operate in accordance with a PtP communication protocol such as the Intel® QuickPath Interconnect (QPI) or the like. In other embodiments, a different interconnect may be used.

In some embodiments, chipset 620 is operable to communicate with processor 610, 605N, display device 640, and other devices 672, 676, 674, 660, 662, 664, 666, 677, etc. Chipset 620 may also be coupled to a wireless antenna 678 to communicate with any device configured to transmit and/or receive wireless signals.

Chipset 620 connects to display device 640 via interface 626. Display 640 may be, for example, a liquid crystal display (LCD), a plasma display, cathode ray tube (CRT) display, or any other form of visual display device. In some embodiments of the invention, processor 610 and chipset 620 are merged into a single SOC. In addition, chipset 620 connects to one or more buses 650 and 655 that interconnect various elements 674, 660, 662, 664, and 666. Buses 650 and 655 may be interconnected together via a bus bridge 672. In one embodiment, chipset 620 couples with a non-volatile memory 660, a mass storage device(s) 662, a keyboard/mouse 664, and a network interface 666 via interface 624 and/or 604, smart TV 676, consumer electronics 677, etc.

In one embodiment, mass storage device 662 includes, but is not limited to, a solid state drive, a hard disk drive, a universal serial bus flash memory drive, or any other form of computer data storage medium. In one embodiment, network interface 666 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 6 are depicted as separate blocks within the system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of 616) can be incorporated into processor core 612.

To better illustrate the methods and apparatuses described herein, a non-limiting set of example embodiments are set forth below as numerically identified examples:

Example 1 includes a microelectronic device including: a semiconductor die. The microelectronic device also includes a substrate having a first surface coupled to the semiconductor die in a first region, the substrate including, conductive traces redistributing contacts of the semiconductor die to laterally offset locations relative to the first region, a first solder resist layer extending over the first surface and a second surface of the substrate, and a second solder resist layer extending over a portion of the first surface or the second surface of the substrate, the second solder resist layer including an electromagnetic shield layer including conductive particles.

Example 2 includes the microelectronic device of Example 1 where the second solder resist layer extends over a portion of the first surface of the substrate outside the first region where the semiconductor die is coupled.

Example 3 includes the microelectronic device of any Examples 1-2, where the conductive particles are arranged proximate an outer surface of the second solder resist layer, where the conductive particles contact one another to form the electromagnetic shield layer.

Example 4 includes the microelectronic device of any Examples 1-3, where the conductive particles include metallic particles.

Example 5 includes the microelectronic device of any Examples 1-4, where the conductive particles include ferrite.

Example 6 includes the microelectronic device of any Examples 1-5, where the conductive particles include metal alloy particles.

Example 7 includes the microelectronic device of any Examples 1-6, where the metallic particles include at least one of nickel, copper, silver, copper-silver, gold-nickel, and tin-silver.

Example 8 includes the microelectronic device of any Examples 1-7, where the second solder resist layer extends over a portion of the substrate having conductive traces coupled to communicate input/output signals presenting a risk of generating electromagnetic interference.

Example 9 includes the microelectronic device of any Examples 1-8, where the second solder resist layer extends over traces carrying memory input/output signals.

Example 10 includes the microelectronic device of any Examples 1-9, where the second solder resist layer extends over traces carrying memory input/output signals cycling at 2.9 GHz or greater.

Example 11 includes the microelectronic device of any Examples 1-10, where the memory input/output signals are DDR5/LDDDR5 signals.

Example 12 includes the microelectronic device of any Examples 1-11, where the conductive particles include metal spheres.

Example 13 includes the microelectronic device of any Examples 1-12, further including a conductive structure extending between the electromagnetic shield layer and a node at a reference voltage.

Example 14 includes the microelectronic device of any Examples 1-13, where the node at a reference voltage is a ground plane.

Example 15 includes method of forming a microelectronic device package, including providing a substrate for the package, the substrate including contacts in a first region of the substrate that are configured to connect to contacts of the semiconductor die, and conductive traces extending from at least some of the substrate contacts to locations laterally offset from the first region. The example also includes forming a first solder resist layer extending over first and second surfaces of the substrate, and forming a second solder resist layer on the first surface of the substrate, in which the second solder resist layer includes conductive particles. The example further includes allowing the conductive particles of the second solder resist layer to settle to form an electromagnetic shield; and connecting a semiconductor die to the contacts in the first region of the substrate.

Example 16 includes the method of example 15, where the first region is on the first surface of the substrate, and where the second solder resist layer is formed on the first surface of the substrate.

Example 17 includes the method of example 15, wherein the first region is on the first surface of the substrate and wherein the second solder resist layer is formed on the second surface of substrate.

Example 18 includes the methods of any of examples 15-17, further including hardening portions of the first solder resist layer before forming the second solder resist layer Example 19 includes the methods of any of examples 15-18, in which allowing the conductive particles of the second solder resist layer to settle to form an electromagnetic shield includes orienting the substrate with the second solder resist layer extending beneath the substrate allowing gravity to assist settling of the conductive particles.

Example 20 includes the methods of any of examples 15-19, in which allowing the conductive particles of the second solder resist layer to settle to form an electromagnetic shield includes establishing a condition of the substrate to promote settling of the conductive particles.

Example 21 includes the methods of any of examples 15-20, including establishing a condition of the substrate to promote settling of the conductive particles that includes elevating the temperature of the substrate.

Example 22 includes the methods of any of examples 15-21, including establishing a condition of the substrate to promote settling of the conductive particles that includes vibrating the substrate.

Example 23 includes the methods of any of examples 15-22, further including hardening of the second solder resist layer after allowing the conductive particles to settle to form an electromagnetic shield Example 24 includes the methods of any of examples 15-23, further including removing non-hardened portions of the first and second layers of solder resist after hardening a portion of the second solder resist layer.

Example 25 includes the methods of any of examples 15-24, where the second solder resist layer extends over a portion of the substrate having conductive traces coupled to communicate input/output signals presenting a risk of generating electromagnetic interference.

Example 26 includes the methods of any of examples 15-25, where the second solder resist layer extends over a portion of the substrate having conductive traces coupled to communicate memory input/output signals Example 27 includes the methods of any of examples 15-26, where the second solder resist layer extends over a portion of the substrate having conductive traces carrying memory input/output signals cycling at 2.9 GHz or greater.

Example 28 includes the methods of any of examples 15-27, where the second solder resist layer extends over a portion of the substrate having conductive traces carrying memory input/output signals that are DDR5/LDDDR5 signals.

Example 29 includes the methods of any of examples 15-29, where the conductive particles comprise metal spheres.

Example 30 includes the methods of any of examples 15-29, where the conductive particles include at least one of ferrite, nickel, copper, silver, and tin-silver.

Example 31 includes the methods of any of examples 15-30, including forming an electrical connection of the electromagnetic shield to a voltage reference.

Example 32 includes the methods of any of examples 15-31, including forming an electrical connection of the electromagnetic shield to a ground.

Example 33 includes the methods of any of examples 15-32, where the second solder resist layer is formed over multiple regions of the substrate Example 34 is a method of forming a microelectronic device package including forming a first solder resist layer over first and second surfaces of a substrate, the substrate having contacts at the first surface to engage a semiconductor die and conductive traces extending from respective contacts and bond pads at the second surface; and further including hardening selected portions of the first solder resist layer; and hand forming a second solder resist layer extending over at least a portion of the first surface of the substrate and over a portion of the first solder resist layer, wherein the second solder resist layer includes conductive particles solder resist layer formed over a portion of the substrate containing conductive traces configured to contact the semiconductor die to carry signals presenting a risk of causing electromagnetic interference. The example further includes positioning the substrate to allow gravity to assist settling of the conductive particles to form an electrically conductive structure in the second solder resist layer and spaced from the first solder resist layer; then removing non-hardening portions of the first solder resist layer and the second solder resist layer; and connecting a semiconductor die to the contacts on the first surface of the substrate.

Example 35 includes the method of example 34, where the conductive traces are configured contact a semiconductor die to carry signals including high-frequency input/output signals.

Example 36 includes any of the methods of examples 34-35, where the conductive traces are configured to contact a semiconductor die to carry memory input/output signals.

Example 37 includes any of the methods of examples 34-36, where the conductive traces are configured to contact a semiconductor die to carry memory input/output signals cycling at 2.9 GHz or greater.

Example 38 includes any of the methods of examples 34-37 where the conductive particles comprise ferrite.

Example 39 includes any of the methods of examples 34-38, where the conductive particles comprise metallic particles.

Example 40 includes any of the methods of examples 34-39, wherein the conductive particles comprise metal alloy particles.

Example 41 includes any of the microelectronic devices of any of Examples 1-14, formed though use of any of the example methods of any of Examples 15-40 of any of Examples methods of examples 34-40, wherein the conductive particles are generally spherical.

Example 42 includes any of the microelectronic devices of any of Examples 1-14, or any microelectronic devices formed though use of any of the example methods of any of Examples 15-40, in an electronic system including a processor; and having a first region of a first surface coupled to the processor, the substrate including, conductive traces redistributing contacts of the semiconductor die to laterally offset locations relative to the first region, a first solder resist layer extending over the first surface and a second surface of the substrate, and a second solder resist layer extending over a portion of the first surface or the second surface of the substrate, the second solder resist layer including an electromagnetic shield layer including conductive particles. The example further including at least one memory device in communication with the processor; and at least one of a mass storage device, a chipset, and a network interface in communication with the processor.

Example 43 includes any of the microelectronic devices of any of Examples 1-14, or any microelectronic devices formed though use of any of the example methods of any of Examples 15-40, in the electronic system of Example 42, where the second solder resist layer extends over a second portion of the first surface of the substrate.

Example 44 includes any of the microelectronic devices of any of Examples 1-14, or any microelectronic devices formed though use of any of the example methods of any of Examples 15-40, in the electronic system of any of examples 42-43, where the second solder resist layer extends over a portion of the substrate containing conductive traces that are coupled to the semiconductor die to communicate input/output signals presenting a risk of generating electromagnetic interference.

Example 45 includes any of the microelectronic devices of any of Examples 1-14, or any microelectronic devices formed though use of any of the example methods of any of Examples 15-40, in the electronic system of any of Examples 42-44, where the second solder resist layer extends over conductive traces carrying memory input/output signals.

Example 45 includes any of the microelectronic devices of any of Examples 1-14, or any microelectronic devices formed though use of any of the example methods of any of Examples 15-40, in the electronic system of any of examples 42-44, where the second solder resist layer extends over conductive traces carrying memory input/output signals cycling at 2.9 GHz or greater.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A microelectronic device, comprising:
 a semiconductor die; and
 a substrate having a first surface coupled to the semiconductor die in a first region, the substrate including conductive traces redistributing contacts of the semiconductor die to laterally offset locations relative to the first region, first selectively hardenable layers extending over the first surface and a second surface of the substrate, and a second selectively hardenable layer extending over a portion of the first surface or the second surface of the substrate, the second selectively hardenable layer comprising an electromagnetic shield layer comprising conductive particles retained in position in the second selectively hardenable layer, wherein the second selectively hardenable layer extends over a portion of the substrate outside of the first region where the semiconductor die is coupled, and does not extend within the first region.

2. A microelectronic device, comprising:

a semiconductor die; and a substrate having a first surface coupled to the semiconductor die in a first region, the substrate including conductive traces redistributing contacts of the semiconductor die to laterally offset locations relative to the first region, first selectively hardenable layers extending over the first surface and a second surface of the substrate, and a second selectively hardenable layer extending over a portion of the first surface or the second surface of the substrate, the second selectively hardenable layer comprising an electromagnetic shield layer comprising conductive particles retained in position in the second selectively hardenable layer, wherein the conductive particles are arranged proximate an outer surface of the second selectively hardenable layer, and wherein the conductive particles contact one another to form the electromagnetic shield layer.

3. The microelectronic device of claim 2, wherein the conductive particles comprise metallic particles.

4. The microelectronic device of claim 2, wherein the conductive particles comprise ferrite.

5. The microelectronic device of claim 1, wherein the metallic particles comprise at least one of nickel, copper, silver, copper-silver, gold-nickel, and tin-silver.

6. The microelectronic device of claim 1, wherein the second selectively hardenable layer extends over a portion of the substrate outside of the first region having conductive traces coupled to communicate input/output signals presenting a risk of generating electromagnetic interference.

7. The microelectronic device of claim 1, wherein the second selectively hardenable layer extends over traces carrying memory input/output signals.

8. The microelectronic device of claim 1, wherein the second selectively hardenable layer extends over traces carrying memory input/output signals cycling at 2.9 GHz or greater.

9. The microelectronic device of claim 1, wherein the conductive particles comprise metal spheres.

10. The microelectronic device of claim 1, further comprising a conductive structure extending between the electromagnetic shield layer and a ground plane.

11. A method of forming a microelectronic device package, comprising:

providing a substrate for the package, the substrate including contacts in a first region of the substrate that are configured to connect to contacts of the semiconductor die, and conductive traces extending from at least some of the substrate contacts to locations laterally offset from the first region;

forming first selectively hardenable layers extending over a first surface and a second surface of the substrate;

forming a second selectively hardenable layer extending over at least a portion of the first surface or the second surface of the substrate, the second selectively hardenable layer comprising conductive particles;

allowing the conductive particles of the second selectively hardenable layer to settle to form an electromagnetic shield; and connecting a semiconductor die to the contacts in the first region of the substrate.

12. The method of claim 11, wherein the first region is on the first surface of the substrate, and wherein the second selectively hardenable layer is formed over the first surface of the substrate.

13. The method of claim 11, wherein allowing the conductive particles of the second selectively hardenable layer to settle to form an electromagnetic shield comprises orienting the substrate with the second selectively hardenable layer extending beneath the substrate allowing gravity to assist settling of the conductive particles.

14. The method of claim 11, wherein allowing the conductive particles of the second selectively hardenable layer to settle to form an electromagnetic shield comprises establishing a condition of the substrate to promote settling of the conductive particles.

15. The method of claim 14, wherein establishing a condition of the substrate to promote settling of the conductive particles comprises elevating the temperature of the substrate.

16. The method of claim 14, wherein establishing a condition of the substrate to promote settling of the conductive particles comprises vibrating the substrate.

17. The method of claim 11, wherein the conductive particles comprise metal spheres.

18. The method of claim 11, wherein the conductive particles comprise at least one of ferrite, nickel, copper, silver, and tin-silver.

19. An electronic system, comprising:

a processor;

a substrate having a first surface coupled to the processor, the substrate including, conductive traces redistributing contacts of the processor to laterally offset locations relative to the first region, first selectively hardenable layers extending over the first surface and a second surface of the substrate, and a second selectively hardenable layer extending over a portion of the first surface or the second surface of the substrate, the second selectively hardenable layer comprising an electromagnetic shield layer comprising conductive particles, wherein the second selectively hardenable layer extends over portions of the substrate outside the first region where the semiconductor die is coupled, and does not extend within the first region;

at least one memory device; and at least one of a mass storage device, a chipset, and a network interface.

20. The electronic system of claim 19, wherein the second selectively hardenable layer extends over a portion of the substrate containing conductive traces coupled to the semiconductor die to communicate input/output signals presenting a risk of generating electromagnetic interference.

21. The electronic system of claim 19, wherein the second selectively hardenable layer extends over conductive traces carrying memory input/output signals.

22. The electronic system of claim 19, wherein the second selectively hardenable layer extends over conductive traces carrying memory input/output signals cycling at 2.9 GHz or greater.

* * * * *